(12) United States Patent
Kim et al.

(10) Patent No.: US 7,932,110 B2
(45) Date of Patent: Apr. 26, 2011

(54) LAYERS AND PATTERNS OF NANOWIRE OR CARBON NANOTUBE USING CHEMICAL SELF ASSEMBLY AND FABRICATING METHOD IN LIQUID CRYSTAL DISPLAY DEVICE THEREBY

(75) Inventors: Jae-Hyun Kim, Gyeonggi-Do (KR);
Bo-Hyun Lee, Gyeonggi-Do (KR);
Tae-Hyoung Moon, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 204 days.

(21) Appl. No.: 12/318,521

(22) Filed: Dec. 30, 2008

(65) Prior Publication Data

US 2010/0065818 A1    Mar. 18, 2010

(30) Foreign Application Priority Data

Feb. 22, 2008   (KR) .................. 10-2008-0016470

(51) Int. Cl.
*H01L 21/76* (2006.01)

(52) U.S. Cl. .................. 438/30; 257/72; 257/E29.168; 977/742

(58) Field of Classification Search .................. 438/30; 257/72, E29.168; 977/742
See application file for complete search history.

*Primary Examiner* — Matthew C Landau
*Assistant Examiner* — Sonya D McCall Shepard
(74) *Attorney, Agent, or Firm* — McKenna Long & Aldridge LLP

(57) ABSTRACT

Disclosed are layers and patterns of nanowire or nanotube using a chemical self assembly for forming a semiconductor layer and a conductive layer of a thin film transistor by using a nanowire and/or nanotube solution and an diamine-based self-assembled monolayer (SAM) material. The Layers and patterns including layers and patterns of nanowire or nanotube using a chemical self assembly include: a substrate having a surface terminated with amine group ($-NH_2$) by using a chemical self-assembled monolayer (SAM) material having at least one end terminated with amine group ($-NH_2$); and a first nanowire or nanotube layer ionically coupled to the amine group ($-NH_2$) of the surface of the substrate.

11 Claims, 7 Drawing Sheets

LAYERS AND PATTERNS OF NANOWIRE OR CARBON NANOTUBE USING CHEMICAL SELF ASSEMBLY AND FABRICATING METHOD IN LIQUID CRYSTAL DISPLAY DEVICE THEREBY

This application claims the benefit of Korean Patent Application No. 10-2008-0016470, filed on Feb. 22, 2008, which is herein incorporated by reference for all purposes as if fully set forth herein.

BACKGROUND OF THE INVENTION

1. Field of the Invention

The present invention relates to a method for forming layers and patterns of nanowire and/or nanotube using a chemical self assembly, and a method for fabricating a liquid crystal display device employing the same, and particularly, to a method of forming layers and patterns of nanowire and/or nanotube using a chemical self assembly for forming a semiconductor layer of a thin film transistor or the like by using a nanowire and/or nanotube solution and an diamine-based self-assembled monolayer (SAM) material, and a method for fabricating a liquid crystal display device by employing the same.

2. Discussion of the Related Art

Nanowires can be divided according to their electrical characteristics into various types, including, for example, metallic nanowire, semiconductor nanowire, and ferrite nanowire. A variety of materials have been reported, as the metallic nanowire, including silver (Ag), gold (Au) and tungsten (W). Also, the semiconductor nanowires representatively include zinc oxide (ZnO) nanowire, gallium nitride (GaN) nanowire and silicon (Si) nanowire. The semiconductor nanowire generally has a diameter less than 100 nm, and a band gap of the semiconductor nanowire can be controlled in the range from 1.1 eV to 3.4 eV, thus to be widely applicable as a material of optical elements, switching devices and the like.

Research has been conducted for carbon nanotube since Dr. Iijima of Meijo University in Japan, who studied an electron microscope, discovered it in 1991. The carbon nanotube has the form of a rolled graphite sheet, and typically has a diameter of 1~20 nm. The graphite has a unique coupling arrangement so as to be in the form of a strong, flat, hexagonal plate film. Upper and lower portions of this film are filled with free electrons. Such free electrons perform a parallel motion with the film in a discrete state. The graphite sheet is spirally rolled up to define a carbon nanotube. Accordingly, an edge coupling is executed at different points. When the spiral shape or chirality of the tube is changed, the free electrons move in a different manner.

Thus, the motion of the free electrons becomes completely free, which requires the nanotube to react like a metal or overcome a band gap like a semiconductor. The size of the band gap depends on a diameter of tube. The diameter of tube can be as small as 1 eV. As such, the carbon nanotube has mechanical rigidity and chemical stability and also can have properties of both semiconductor and conductor. Also, in view of its characteristics of small diameter, long length and hollow shape, the carbon nanotube is widely used as a material of flat panel display devices, transistors, energy storages and the like. In addition, it can be applicable to a variety of nano-sized electric devices.

As methods for arranging the carbon nanotube on a base (or substrate), there have been reported a method for substituting an end of carbon nanotube with sulfur so as to arrange on gold by Zhongfan Liu, et al (Peking University, China) (Langmuir, Vol. 16, p. 3569 (2000)), and a document disclosing that carboxyl group (—COOH) reacts on an amine-processed substrate using amide for perpendicular arrangement (Chemphyschem 2002, No. 10). Also, for patterning carbon nanotube, several methods are employed, including a method, reported in Chemical Pysics Letters 303, p. 125 (1999), in which a self-assembled monolayer (SAM) of trimethylsilyl is formed on a silicon substrate to be patterned using e-means, and an amine group is adsorbed on the thusly-generated patterns so as to adsorb the carbon nanotube on the patterns, a simple adsorption method using an interfacial characteristic as reported in Advanced Materials 2002, 14, No. 12, p. 899, and the like.

In addition, a method for forming a carbon nanotube layer and patterns using a chemical self-assembly is disclosed in U.S.A. Laid-Open Publication No. U.S. Pat. No. 6,960,425. Explaining essential contents of the method, the surface of a substrate, such as a silicon wafer or a plastic, is made to be terminated with amino group (—NH$_2$) using a first self-assembled monolayer (SAM) material, for example, aminocarboxylic acid, aminocarboxyl siloxane or diamine. Next, a second SAM material, such as a carbon nanotube solution, prepared by coupling the aminocarboxylic acid to the carbon nanotube so as to make an acid radical of the carbon nanotube ended with carboxyl group (—COOH), is formed onto the base having the surface terminated with the amino group (—NH$_2$) to fabricate the first carbon nanotube film.

A third SAM material, such as a diamine-based SAM material, is coated such that the surface of the first carbon nanotube film formed on the substrate is aminated (—NH$_2$) again. Afterwards, the second SAM material, such as the above carbon nanotube solution or the like, is formed on the substrate, to fabricate the second carbon nanotube film.

Such processes are repeated to control the thickness per each layer.

However, the method requires complicated processes during the SAM processing on the surface of the carbon nanotube, which causes an increase in a tact time, resulting in a yield decrease. Also, the process for aminating (—NH$_2$) the surface of the carboxyl group (—COOH) is further performed, thereby further requiring the tact time.

Furthermore, a device characteristic is deteriorated on the surface of the carbon nanotube due to SAM polymerization and non-uniformity of concentration. A conductance is also affected by an increase in carbon content, causing a deterioration of a peculiar property of the carbon nanotube.

SUMMARY OF THE INVENTION

Accordingly, the present invention is directed to layers and patterns of nanowire or carbon nanotube using chemical self assembly and a fabricating method in liquid crystal display device that substantially obviates one or more problems due to limitations and disadvantages of the related art.

An advantage of the present invention is to provide layers and patterns of nanowire or nanotube using a chemical self assembly controlling each monolayer, by using a diamine-based SAM material and a nanowire or nanotube solution, and a method for fabricating a liquid crystal display device configuring monolayers by applying such method to a semiconductor layer, metal electrode, or the like of a switching device or transparent electrode.

To achieve these and other advantages and in accordance with the purpose of the present invention, as embodied and broadly described herein, there is provided layers and patterns of nanowire or nanotube using a chemical self assembly comprising: a substrate having a surface terminated with amine group (—NH$_2$) by using a chemical self-assembled monolayer (SAM) material having at least one end terminated with amine group (—NH$_2$); and a first nanowire or nanotube layer ionically coupled to the amine group (—NH$_2$) of the surface of the substrate.

In another aspect of the present invention, a method for fabricating a liquid crystal display device may include, preparing a substrate; forming, on the substrate, a plurality of gate lines and gate electrodes, each of the gate lines extending from each of the gate electrodes; forming a gate insulating layer on the substrate including the gate lines and the gate electrodes; forming a chemical self-assembled monolayer (SAM) material having at least one end terminated with amine group (—NH) to be overlapped on the gate electrodes with the gate insulating layer interposed therebetween; coating a nanowire or nanotube solution on the SAM material to form a semiconductor layer consisting of the SAM material and the nanowire or nanotube solution, forming a source electrode and a drain electrode on the semiconductor layer; forming a passivation layer on the source electrode and the drain electrode; forming a contact hole for exposing the drain electrode on the passivation layer; and forming a pixel electrode contacting the drain electrode through the contact hole.

The steps of forming the SAM material and coating the nanowire or nanotube solution are alternately performed.

It is to be understood that both the foregoing general description, and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail of a method for forming layers and patterns of nanowire and/or carbon nanotube using a chemical self assembly, and a method for fabricating a LCD device employing the same according to the present invention, with reference to the accompanying drawings.

Figure 1A:
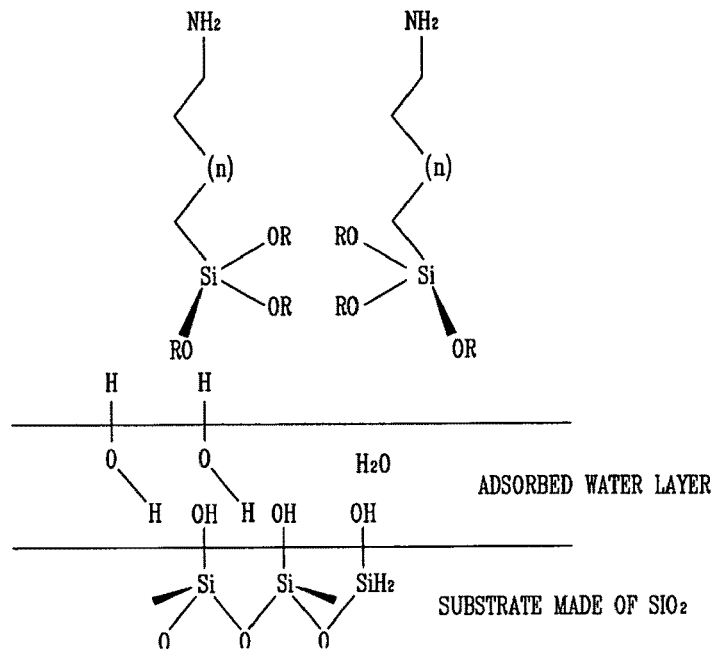
FIGS. 1a to 1d are views showing a state of a self-assembled monolayer material (i.e., SAM material) being deposited on a substrate.
Figure 1B:
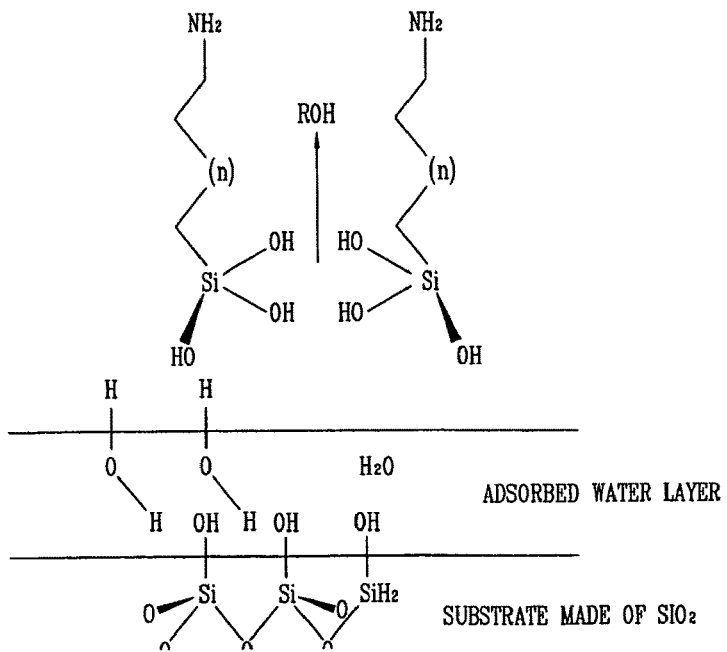
Figure 1C:
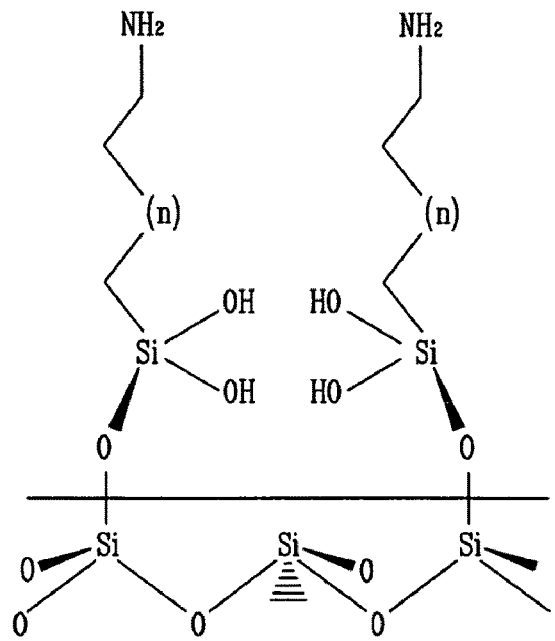
Figure 1D:
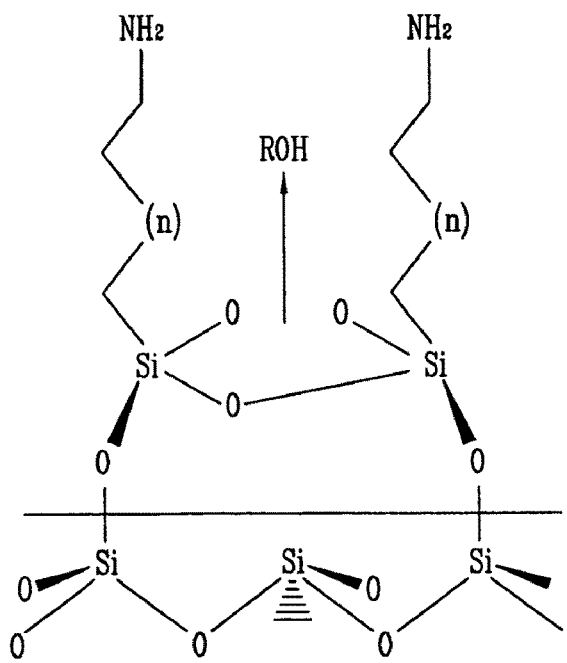
Figure 2A:
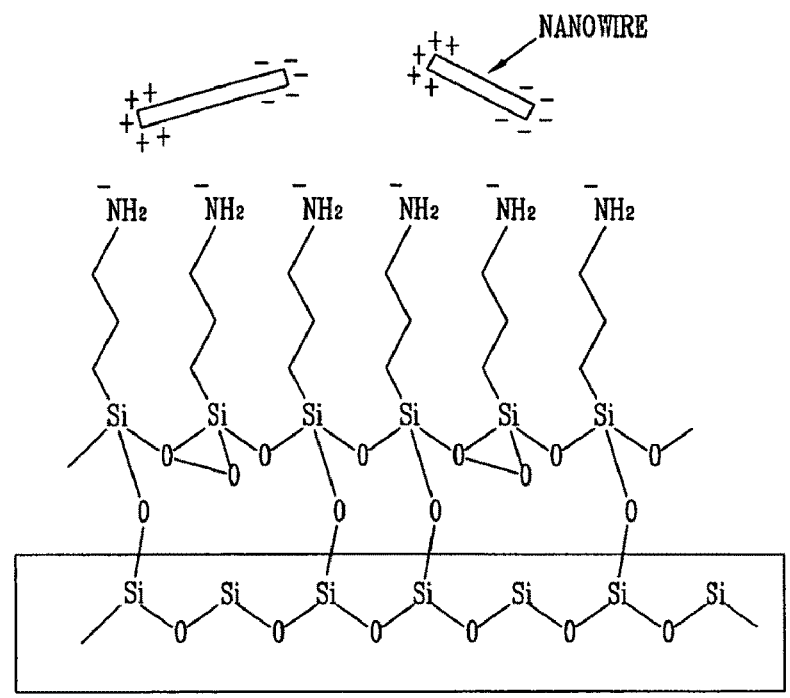
FIGS. 2a and 2b are views showing a coupled state between a SAM material and a nanowire.
Figure 2B:
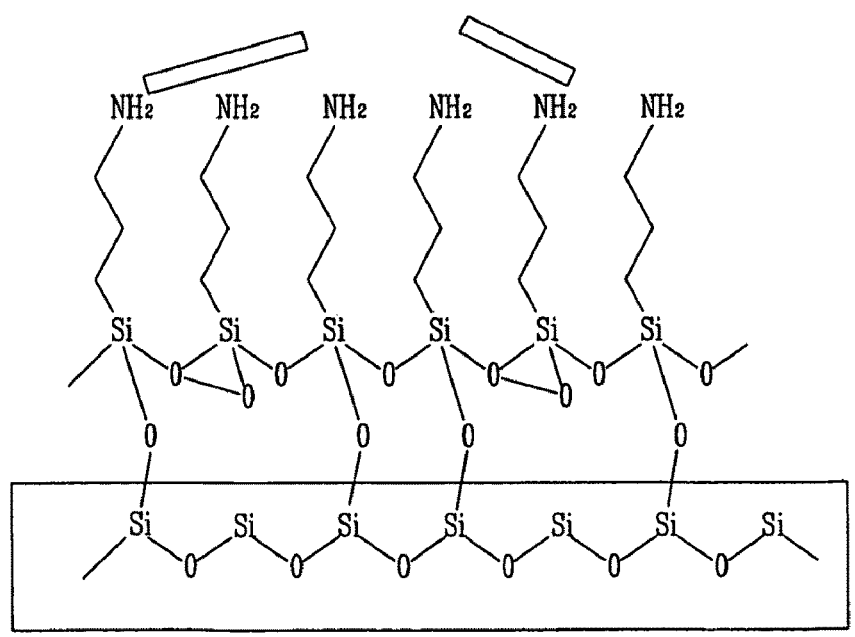
Figure 3:
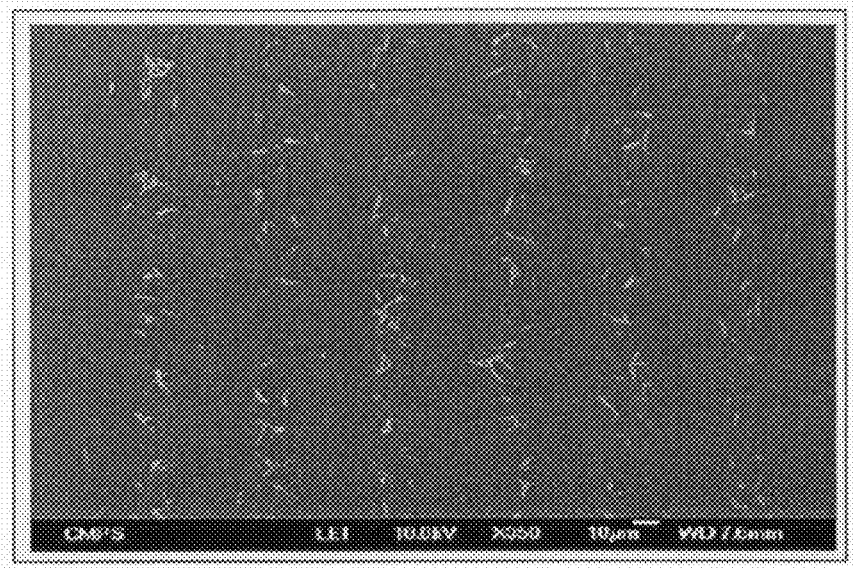
FIG. 3 is a scanning electron macroscopic (SEM) photograph of a substrate surface after patterning a nanowire thereon once in accordance with an embodiment of the present invention.
Figure 4:
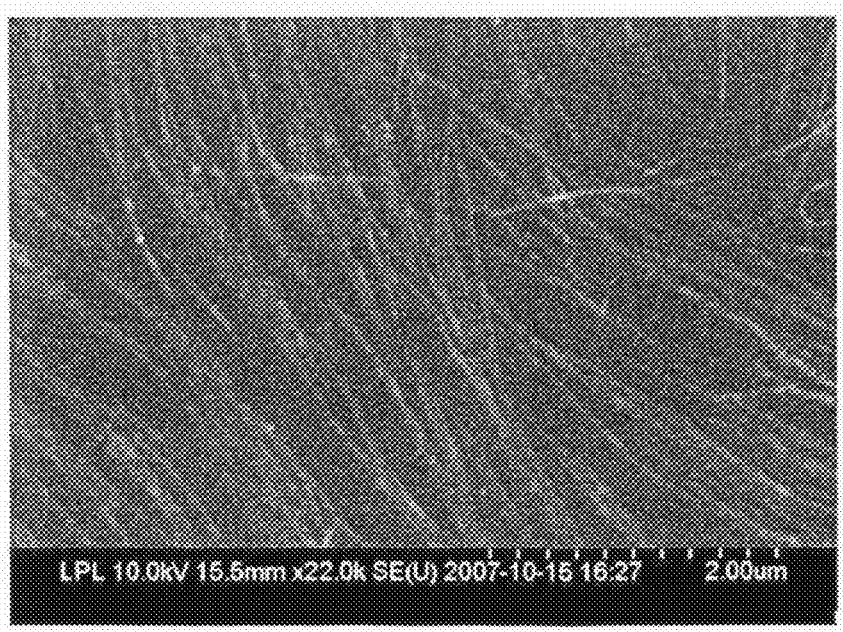
FIG. 4 is a SEM photograph of a substrate surface after laminating a carbon nanotube thereon once in accordance with another embodiment of the present invention.

FIGS. 1a to 1d are views showing a state of a self-assembled monolayer material (i.e., SAM material) being coated on a substrate, FIGS. 2a and 2b are views showing a coupled state between a SAM material and a nanowire, FIG. 3 is a scanning electron macroscopic (SEM) photograph of a substrate surface after patterning a nanowire thereon once in accordance with an embodiment of the present invention, and FIG. 4 is a SEM photograph of a substrate surface after laminating a carbon nanotube thereon once in accordance with another embodiment of the present invention.

A method for forming monolayers by employing a chemical self assembly according to the present invention will be described as follows.

Substrate Surface Termination

First, a substrate is prepared. Here, the substrate may be made of one of silicon (Si), silicon nitride (SiNx), silicon dioxide (SiO$_2$) and high dielectric film (High-K). The high dielectric film, which is a metallic oxide having a dielectric constant higher than that of the silicon dioxide (SiO$_2$), can have a much greater capacitance under the same applied voltage.

On the substrate made of such material, an initial chemical self-assembled monolayer (SAM) material having at least one end ended with amine group (—NH$_2$), such as aminoalkyl siloxane or (alkyl)diamine, is formed on the substrate in order to terminate the surface of the substrate with the amine group (—NH$_2$). Here, in order to enhance a transfer rate of the initial substrate, a surface treatment using ultraviolet (UV) or plasma may further be executed.

The SAM material can be transferred by using several methods, including coating the SAM material on the substrate by means of a roll printing, coating it on the substrate by means of a micro-contact printing using a separate polydimethylsiloxane (PDMS) mold, or other methods using various solutions.

According to those methods, the carbon nanotube coupled to the SAM material is laminated on the full substrate or forms patterns on a partial portion of the substrate. Among others, the micro-contact printing using the PDMS mold can be suitable for forming patterns.

Also, in relation to the termination of the substrate surface with the amino group (—NH$_2$), for example, as disclosed in an article of "J. B Brzoska, I. B. Azouz and F. Rondelez, Langmuir, 10, 4367(1994)", a surface termination by coating a SAM material of aminoalkyl siloxane on a substrate made of silicon dioxide (SiO$_2$) can be applied.

Briefly explaining, the SAM material of aminoalkyl siloxane, as shown in FIGS. 1a to 1d, is chemically adsorbed on the substrate sequentially through about four steps, for example, physisorption, hydrolysis, covalent grafting to the substrate and in-plane reticulation.

The present invention may not be limited to coating the SAM material, such as the aminoalkyl siloxane, on the substrate made of the silicon dioxide (SiO$_2$). As mentioned above, depending on which SAM material is coated on a substrate possibly made of various materials, among SAM materials each having one end ended with amine group (—NH$_2$), such as aminoalkyl siloxane or (alkyl)amine, an operation mechanism can be slightly changed.

Lamination of Carbon Nanotube (or Nanowire): Forming of First Layer

Also, a carbon nanotube (or nanowire) solution is formed onto the substrate which is all or partially terminated with the amine group by using the SAM material, namely, to the aminated (—$NH_2$) substrate, thereby forming a first layer as a monolayer. Here, the carbon nanotube (or nanowire) solution can be prepared by mixing a carbon nanotube (or nanowire) material in the form of powder with water and alcohol. Accordingly, when the aminated (—$NH_2$) substrate dips into a container containing the thusly-prepared carbon nanotube (or nanowire) solution, the carbon nanotube (or nanowire) solution is ionically coupled to the aminated (—$NH_2$) substrate.

As shown in FIGS. 2a and 2b, a one-dimensional nano material, such as carbon nanotube (or nanowire), can have a dipole moment by an occurrence of a partial charge separation due to external circumstances, for example, static electricity, magnetic field or the like. The dipole moment is induced by an unshared electron pair existing in N element of the SAM material (referred to as polarization). As a result, a negative charge of the amine group (—$NH_2$) is ionically coupled to the carbon nanotube (or nanowire).

Accordingly, the lamination (or patterning) is executed for the carbon nanotube (or nanowire) to be arranged on the substrate, thereby forming a monolayer. For example, as shown in FIG. 3, a SAM material of amino-propyl triethoxysilane (APS) having chemically coupled to a glass substrate and a nanowire made of zinc oxide (ZnO) having a length of 10 μm or more, which has been ionically coupled to the SAM material, are patterned so as to form the monolayer. Here, the nanowire made of zinc oxide (ZnO) being patterned on the substrate to form the monolayer is in the form of band. Also, as shown in FIG. 4, the carbon nanotube is also coupled to the SAM material on the substrate to form the monolayer which is integrated on the entire substrate.

Surface Termination of First Layer

Afterwards, a SAM material, such as carboxyldiamine, having two end ended with amine group (—$NH_2$) is formed again on the substrate having the first layer formed thereon, thereby to terminate the surface of the first layer. Here, similar to the above mentioned, the SAM material may also be formed on the substrate using various methods, such as the roll printing, the micro-contact printing using a separate PDMS mold, dipping or the like.

Other details are the same to the initial substrate termination as previously described, and thus explanation thereof will not be repeated.

Lamination of Carbon Nanotube (or Nanowire): Forming of Second Layer

Next, the carbon nanotube solution is coated again on the SAM material chemically coupled to the first layer of the substrate, having the end ended with the amine group (—$NH_2$), thereby forming a second layer. Here, similar to the method of forming the first layer, the carbon nanotube solution can be prepared by mixing a carbon nanotube (or nanowire) material in the form of powder with water and alcohol. Accordingly, when the aminated (—$NH_2$) substrate dips into a container containing the thusly-prepared carbon nanotube (or nanowire) solution, the carbon nanotube (or nanowire) solution is ionically coupled onto the aminated (—$NH_2$) substrate.

After forming the final layer, such the second layer, a SAM removing process and a UV and thermal treatment process are further performed in order to improve the characteristic of the laminated layer (or laminated pattern).

Accordingly, in order to form at least one carbon nanotube monolayer on the substrate, the carbon nanotube solution obtained by mixing the SAM material having the amine (—$NH_2$), the powder type carbon nanotube and water is simply repeatedly used. Accordingly, the fabricating process can be simplified, resulting in a reduction of fabricating cost.

Also, the carbon nanotube solution can uniformly be coated on the substrate without being massed, thus to prevent a deterioration caused by such mass.

As described above, layers and patterns of nanowire and/or carbon nanotube using a chemical self assembly are configured such that a first carbon nanotube (or nanowire) layer is formed on a substrate on which a SAM material is formed to be then aminated. On the substrate may further repeatedly be stacked a SAM material layer, and a second carbon nanotube (or nanowire) layer on the SAM material.

The first and second nanotube (or nanowire) layers may have semiconducting or conducting nanowires (nanotubes). When the nanowires (or nanotubes) of the first and second nanotube (or nanowire) films are semiconducting nanowires (or nanotubes), the layers and patterns according to the present invention can be used as semiconductors, When the nanowires (or nanotubes) are conducting nanowires (or nanotubes), the layers and patterns can be used as conductors. Here, in case where the nanowires (or nanotubes) of the first and second nanotube (or nanowire) films are semiconducting nanowires (or nanotubes), if the nanowires (or nanotubes) are repeatedly formed plural times, the layers and patterns according to the present invention may be used as conductors.

When the nanowires (or nanotubes) of the first and second nanotube (or nanowire) layers are semiconducting nanowires (or nanotubes) and the layers and patterns according to the present invention are used as semiconductors, the SAM material layer and the second carbon nanotube (or nanowire) layer on the SAM material layer are preferably repeatedly formed 1 to 10 times. When the nanowires (or nanotubes) of the first and second nanotube (or nanowire) layers are conducting nanowires (or nanotubes) and the layers and patterns according to the present invention are used as conductors, the SAM material layer and the second carbon nanotube (or nanowire) layer are preferably repeatedly formed 2 to 100 times.

Figure 5:
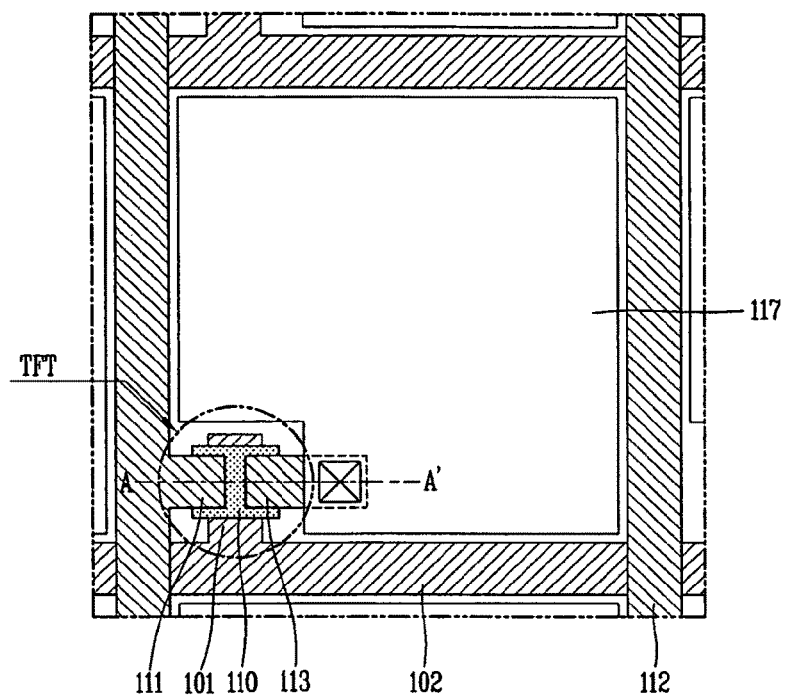
FIG. 5 is a view showing a unit pixel of a liquid crystal display (LCD) device having a semiconductor layer of a thin film transistor (TFT) according to a chemical self assembly.

FIG. 5 is a view showing a unit pixel of a liquid crystal display (LCD) device having a semiconductor layer of a thin film transistor (TFT) according to a chemical self assembly.

As shown in FIG. 5, a liquid crystal display (LCD) device according to the present invention may include a plurality of gate lines 102 and data lines 112 crossing each other on a substrate to define (or segment) unit pixel regions, thin film transistors (TFTs) formed at each crossing between the gate lines 102 and the data lines 112, and pixel electrodes 117 formed at the unit pixel regions excluding regions having the TFTs formed thereat. Each TFT may include a gate electrode 101 extending from the gate line 102, a semiconductor layer 110 made of carbon nanotube (or nanowire) formed by the SAM technique, and overlapped on the gate electrode 101 with a gate insulating layer (not shown) interposed therebetween, a source electrode 111 extending from the data line 112 and overlapped on the gate electrode 101, and a drain electrode 113 overlapped on the gate electrode 101 with facing the source electrode 111. Here, the drain electrode 113 can be electrically conductive through a contact hole on a passivation layer (not shown) interposed between the drain electrode 113 and the pixel electrode 117.

FIGS. 6A to 6G are views showing a method for fabricating a LCD device based upon the section taken along the line A-A' of FIG. 5.

Figure 6A:
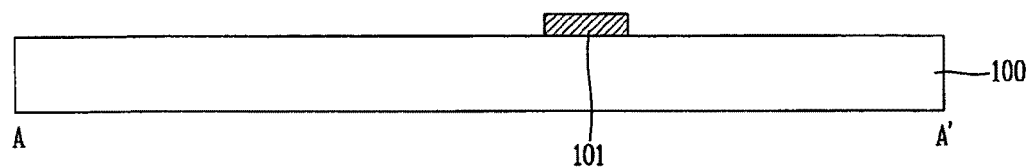
FIGS. 6a to 6g are views showing a method for fabricating a LCD device based upon the section taken along the line A-A' of FIG. 5.

As shown in FIG. 6A, a gate electrode 101 and a gate line are formed on a substrate 100 (hereinafter, referred to as 'first substrate'). In other words, a first photolithographic process is executed. Namely, a metallic film to form the gate electrode 101 ad the gate line is deposited on the first substrate 100, which is then coated with a photoresist. The photoresist-coated metallic film is then exposed after applying a first mask thereon. Such exposed metallic film is developed and etched so as to form the gate electrode 101 and the gate line on the substrate 100.

Figure 6B:
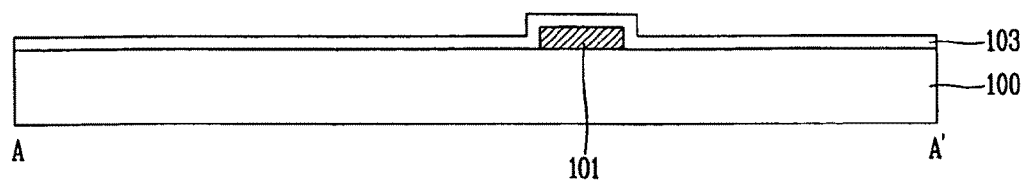

Next, as shown in FIG. 6B, a gate insulating layer 103 is deposited on the first substrate 100 on which the gate electrode 101 is formed. Here, the gate insulating layer 103 may be formed of silicon nitride (SiNx), silicon dioxide ($SiO_2$) and the like, thus to configure at least one layer.

Figure 6C:
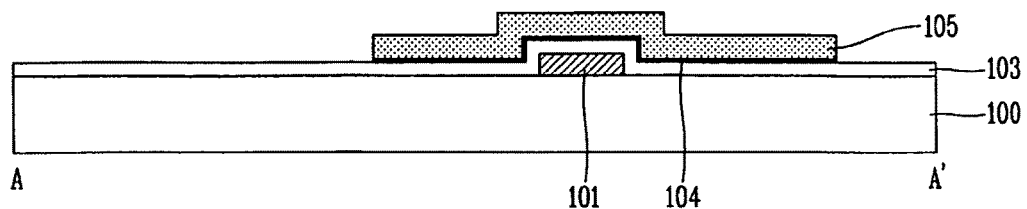

As shown in FIG. 6C, an initial SAM material 104 having one end ended with amine group, such as aminoalkyl siloxane or diamine, is formed on the gate insulating layer 103 at the overlapped area with the gate electrode 101, such that the surface of the gate insulating layer 103 can be terminated with the amine group. Here, in order to increase a transfer rate, a surface treatment (termination) method using ultraviolet or plasma can further be used for the first substrate 100.

Here, the SAM material 104 is formed on the first substrate 100 by a roll printing or a micro-contact printing using a separate PDMS mold. Accordingly, —OH group of the first substrate 100 and alkylsiloxane group or amine group existing at one end of the SAM material 104 are chemically coupled to each other.

After aminating the surface of the first substrate 100 having the insulating layer 103 by forming the SAM material 104 thereon, a carbon nanotube (or nanowire) solution is coated on the gate insulating layer 103, so as to form a first layer 105 as a monolayer. Here, the carbon nanotube solution is prepared by mixing a powder type carbon nanotube material with alcohol and water into one solution. The carbon nanotube solution is ionically coupled to the aminated ($—NH_2$) first substrate 100, thus to form the first layer 105.

Figure 6D:
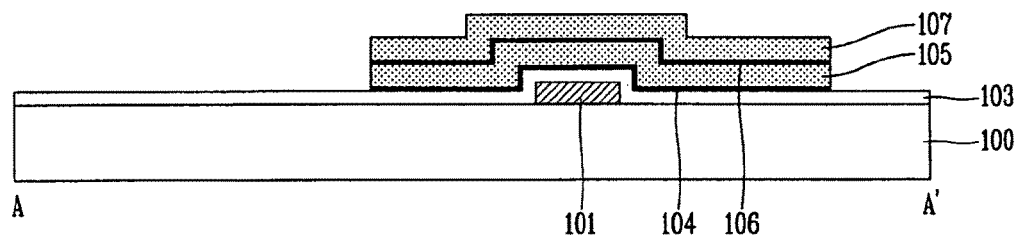

As shown in FIG. 6D, a simple repetition of the steps shown in FIG. 6c forms a second layer 107 on the first layer 105. Namely, a SAM material 106 having two end ended with the amine group, such as aminoalkyl siloxane or diamine, is formed on the first layer 105 at the overlapped area with the gate electrode 101, so as to terminate the surface of the first layer 105 with the amine group. Then, the aminated ($—NH_2$) first substrate 100 dips into a container with the carbon nanotube solution. Accordingly, the carbon nanotube solution is ionically coupled onto the aminated (—NH2) first substrate 100, thus to form the second layer 107 on the first layer 105.

Figure 6E:
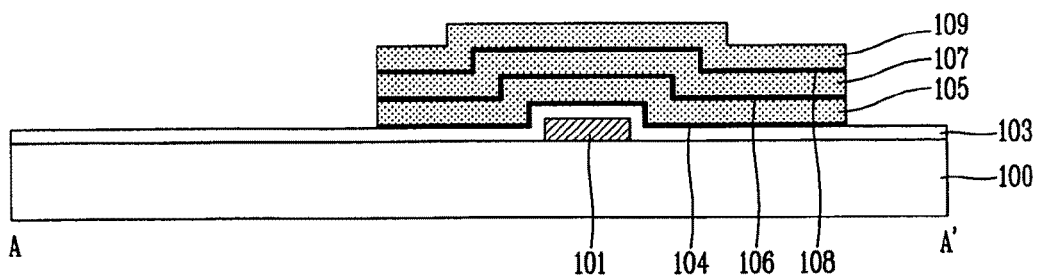

As shown in FIG. 6E, by using the same method of forming the second layer 107 in FIG. 6D, a third layer 109 is formed. That is, a SAM material 108 having two end ended with the amine group, such as aminoalkyl siloxane or diamine, is formed on the second layer 107 overlapped on the gate electrode 101 or the first layer 105 on the first substrate 100. The SAM material 108 is ionically coupled to the carbon nanotube solution, thus to form the third layer 109.

As such, the sequentially laminated first to third layers 105, 107 and 109 implement a semiconductor layer. Each monolayer forming the semiconductor layer can be integrated only at an area on which the carbon nanotube is arranged and accordingly SAM molecules are transferred. It can be understood that the carbon nanotube can be patterned in accordance with the patterns of the SAM material. However, since the carbon nanotube provides a low degree of integration at a level of monolayer, in order to use the carbon nanotube for the semiconductor layer, it is preferable to form the semiconductor layer as a multi-layer with about three layers, as shown in the present invention.

However, each monolayer configuring the multi-layer can be changed according to a concentration of carbon, namely, carbon content, or the like of the carbon nanotube solution to form the monolayer. The multi-layer may not be limited to such three layers.

For example, as shown in the present invention, if it is assumed that each monolayer configuring the first to third layers 105, 107 and 109 is several tens of nanometers thick, the total thickness of the first to third layers 105, 107 and 109 configuring the multi-layer can be several hundreds of nanometers. This may play an important role to determine on/off characteristics of the TFT. If the total thickness of the first to third layers 105, 107 and 109 configuring the multi-layer is too thick, it instead increases an off current (Ioff) of the TFT, which may reduce the characteristic of the device.

Figure 6F:
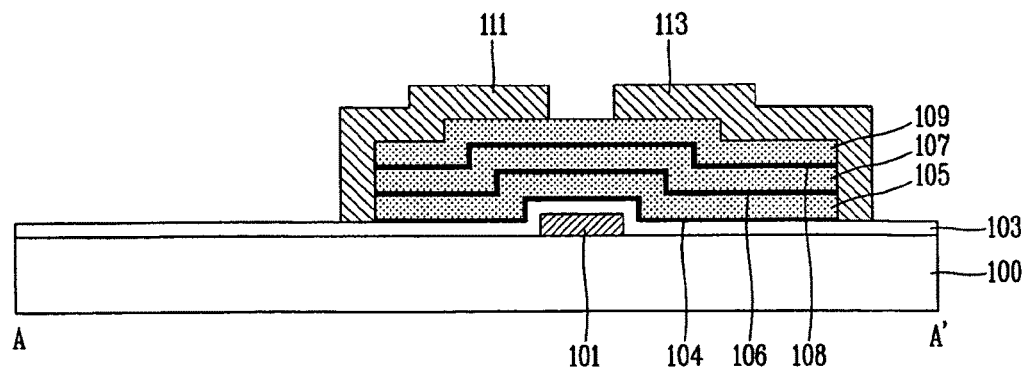

Also, as shown in FIG. 6F, source and drain electrodes 111 and 113 are formed on the semiconductor layer implemented by a multi-layered carbon nanotube with being overlapped on the gate electrode, on the first substrate 100. The source and drain electrodes 111 and 113 are formed by a second photolithographic process. In other words, a metallic film, such as chromium (Cr), molybdenum (Mo), titanium (Ti) or the like, is deposited on the entire first substrate 100 having the semiconductor layer formed thereon. Afterwards, the metallic layer is coated with a photoresist to be exposed after a photo mask is applied thereon. Then, the exposed metallic layer is developed and etched, thereby forming the source and drain electrodes 111 and 113.

Here, a gap between the source and drain electrodes 111 and 113 formed by being partially overlapped with the gate electrode 101 on the semiconductor layer may influence the total thickness of the first and third layers 105, 107 and 109. That is, during the fabricating process of the LCD device, after the gap between the source and drain electrodes 111 and 113 is first determined, each thickness of the first and third layers 105, 107 and 109 configured as each monolayer at the semiconductor layer is determined, or the number of laminating a monolayer is determined. Alternatively, in the contrary, after determining the total thickness of the semiconductor layer, the gap between the source and drain electrodes 111 and 113 can be adjusted.

Figure 6G:
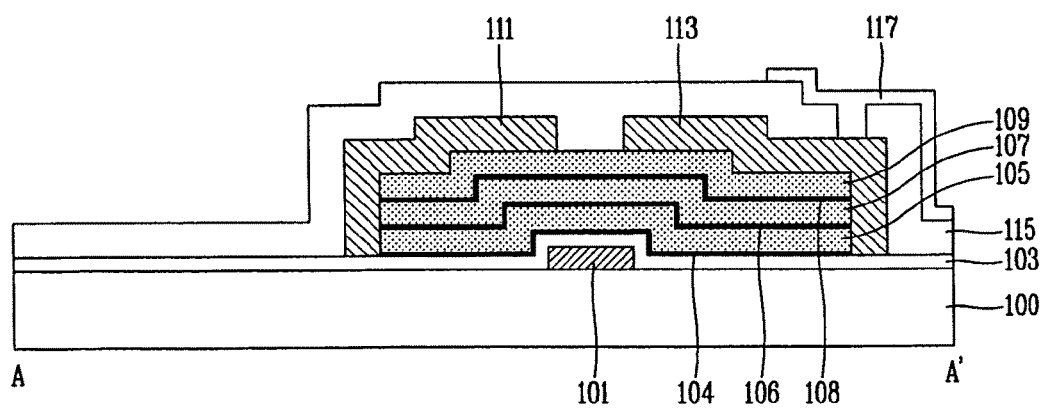

As shown in FIG. 6G, a passivation layer 115 is formed on the entire first substrate 100 having the source and drain electrodes 111 and 113 formed thereon. Here, the passivation layer 115 may be an inorganic insulating layer, such as silicon nitride (SiNx), or an organic insulating layer. The passivation layer 115 may include a contact hole for partially exposing the drain electrode 113 to the exterior. Such contact hole may be formed by a third photolithographic process, as similar to the aforementioned.

Also, referring to FIG. 6G, a pixel electrode 117 is formed on the first substrate 100 having the passivation layer 115 thereon. The pixel electrode 117 may be formed by a fourth photolithographic process. That is, a transparent conductive material, such as indium tin oxide (ITO), indium zinc oxide (IZO) or the like, is deposited on the entire first substrate 100 having the passivation layer 115 formed thereon. Afterwards, the transparent conductive material is coated with a photoresist and then exposed after applying a photo mask thereon. The exposed material is then developed and etched, thereby forming the pixel electrode 117.

Accordingly, the pixel electrode 117 on the unit pixel region defined by each gate line and data line crossing each other on the first substrate 100 is electrically connected to the drain electrode 113 through the contact hole formed on the passivation layer 115.

The thusly-formed TFT array substrate is bonded with the color filter substrate with a liquid crystal layer interposed therebetween, thus to construct a LCD device.

Hereinafter, a color filter substrate will briefly be described, although not shown in the figures.

A black matrix for partitioning color filter regions is formed on a separate substrate (hereinafter, referred to as 'second substrate'), corresponding to the gate line and data line on the first substrate.

Next, red (R), green (G) and blue (B) color filters are sequentially formed on the second substrate having the black matrix. Here, each of the color filters is formed by a photolithographic process. For example, a red resin is coated on the full second substrate having the black matrix formed thereon, and then exposed after applying a mask thereon. The red resin is then developed and etched, so as to form the R color filter. In the same manner, the rest of G and B color filters are sequentially formed.

An overcoat layer may be formed on the second substrate having the black matrix and R, G and B color filters. The overcoat layer may serve to level the R, G and B color filters.

A transparent electrode is deposited on the full second substrate having the overcoat layer, thus to form a common electrode.

On such fabricated first substrate 100 and second substrate, an alignment layers are separately formed, and a liquid crystal is interposed between the alignment layers, so as to construct the LCD device.

The LCD device described so far is merely one example to which the scope of the present invention is applied. Thus, other embodiments can be implemented according to the fabricating method having described.

For example, a LCD device can be fabricated by including an anti-electrostatic layer for preventing static electricity. The anti-electrostatic layer may also be formed by employing the chemical self assembly.

In addition, the present invention can be applied when forming a conductive layer, such as the gate electrode, the source electrode, the drain electrode and the pixel electrode on the TFT array substrate and a common electrode on the color filter substrate.

As described above, the present invention can simplify a fabricating process by forming each monolayer only using a nanowire or nanotube solution and amine-based SAM material, which allows a reduction of time and fabricating cost and an increase in yield.

In addition, a monolayer with a uniform thickness can be formed on a large substrate through a simple process without the mass of carbon nanotube solution, so as to prevent deterioration of the device as compared to the related art.

Also, such process is not needed to be performed by using separate vacuum equipment, thereby saving cost required for such equipment.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a liquid crystal display device comprising:
   preparing a substrate;
   forming, on the substrate, a plurality of gate lines and gate electrodes, each of the gate lines extending from each of the gate electrodes;
   forming a gate insulating layer on the substrate including the gate lines and the gate electrodes;
   forming a chemical self-assembled monolayer (SAM) material having at least one end terminated with amine group (—NH) to be overlapped on the gate electrodes with the gate insulating layer interposed therebetween;
   coating a nanowire or nanotube solution on the SAM material to form a semiconductor layer consisting of the SAM material and the nanowire or nanotube solution,
   forming a source electrode and a drain electrode on the semiconductor layer;
   forming a passivation layer on the source electrode and the drain electrode;
   forming a contact hole for exposing the drain electrode on the passivation layer; and
   forming a pixel electrode contacting the drain electrode through the contact hole, wherein the steps of forming the SAM material and coating the nanowire or nanotube solution are alternately performed.

2. The method of claim 1, wherein the gate insulating layer is formed of silicon nitride (SiNx).

3. The method of claim 1, wherein the SAM material having the at least one end ended with the amine group (—NH) is one of aminoalkyl siloxane or diamine.

4. The method of claim 1, wherein the SAM material is transferred by coating the SAM material on the substrate by means of a roll printing.

5. The method of claim 1, wherein the SAM material is transferred by coating the SAM material on the substrate by means of a micro-contact printing using a polydimethylsiloxane (PDMS) mold.

6. The method of claim 1, wherein the nanowire or nanotube solution is obtained by mixing a nanowire or carbon nanotube material in the form of powder with water and alcohol.

7. The method of claim 1, wherein the nanowire is formed of one of zinc oxide (ZnO), gallium nitride (GaN) and silicon (Si).

8. The method of claim 1, wherein the steps of forming the SAM material and coating the nanowire or nanotube solution are respectively performed at least three times.

9. The method of claim 1, wherein the step of forming the gate lines and gate electrodes comprises:
   forming a chemical self-assembled monolayer (SAM) material having at least one end terminated with amine group (—NH) on the substrate; and
   coating a nanowire or nanotube solution on the SAM material to form the gate lines and gate electrodes consisting of the SAM material and the nanowire or nanotube solution.

10. The method of claim 1, wherein the step of forming the source electrode and the drain electrode comprises:

forming a chemical self-assembled monolayer (SAM) material having at least one end terminated with amine group (—NH) on the semiconductor layer; and coating a nanowire or nanotube solution on the SAM material to form the source electrode and the drain electrode consisting of the SAM material and the nanowire or nanotube solution.

11. The method of claim 1, wherein the step of the pixel electrode is comprising:

forming a chemical self-assembled monolayer (SAM) material having at least one end terminated with amine group (—NH) on the passivation layer; and coating a nanowire or nanotube solution on the SAM material to form the pixel electrode consisting of the SAM material and the nanowire or nanotube solution.

* * * * *